Nov. 22, 1966 G. KÖHL 3,287,182

SEMICONDUCTOR ARRANGEMENT

Filed Sept. 25, 1964

INVENTOR
Günter Köhl

BY Spencer & Kaye
ATTORNEYS

United States Patent Office 3,287,182
Patented Nov. 22, 1966

3,287,182

SEMICONDUCTOR ARRANGEMENT

Günter Köhl, Konigstein, Taunus, Germany, assignor to Licentia Patent-Verwaltungs-G.m.b.H., Frankfurt am Main, Germany Filed Sept. 25, 1964, Ser. No. 399,320
Claims priority, application Germany, Sept. 25, 1963, L 45,951
3 Claims. (Cl. 148—33.5)

The present invention relates to a semiconductor arrangement which incorporates three or more layers of alternating conductivity.

The operation and quality of a semiconductor element having barrier layers are characterized, mainly, by the reverse characteristics. The reverse or blocking characteristics of a semiconductor element having a plurality of layers is determined, among other things, mainly by the separation of the blocking or barrier layers when a reverse voltage is applied and by the critical field strengths which appear at the barrier layer. In particular, due consideration has to be given to the fact that as the field strength increases to certain values, a breakdown will occur both at the surface as well as in the mass of the element. While a breakdown in the field strength within the mass or volume is a reversible process, a field strength breakdown at the surface is always an irreversible process which inevitably brings with it a destruction of the pn-junction and hence renders the semiconductor element useless. Accordingly, there is provided a semiconductor element having pn-junctions whose mass will undergo field strength breakdown, this being the so-called reversible volume breakdown at a voltage which is below the voltage which results in the irreversible field strength breakdown, this being the so-called surface breakdown. Such a semiconductor element may then be so rated that the load will be up to the point where the field strength breakdown of the barrier layer occurs within the interior of the semiconductor.

As is well known in the art, when a voltage is applied the barrier layer of a pn-junction expands, principally into that layer of the two layers forming the pn-junction of different conductivity which has the lower doping. The field strength which leads to field strength breakdown at the edge of the barrier layer next to the surface can be increased only by increasing the expanse of the barrier layer at the surface with respect to that within the element. In this way, the voltage at which field strength breakdown occurs at the surface can be increased so as to be larger than the voltage resulting in volumetric breakdown and hence the voltage at which the volumetric breakdown occurs first.

For purposes of explanation, reference is made to FIGURE 1 which shows a semiconductor arrangement according to the prior art, wherein the increase expansion of the barrier layer at the surface of the one pn-junction 2 is obtained by suitably designing the surface geometry. For example, that portion of the surface which intersects the planes of the pn-junctions is inclined. The barrier layer expansion of a barrier layer will run, primarily, into the more weakly doped material, for example, the n-conductive region, while that portion of the expansion which runs into the more strongly doped material, for example, the diffused $p^+$-zone, is kept relatively small due to the exponential impurity profile of such a zone.

In the arrangement of FIGURE 1, the surface expansion of the barrier layer of the pn-junction 1 does not become substantially larger than the volumetric expansion of the barrier layer, at which, upon the application of a volumetric field strength, volumetric breakdown would occur.

Insofar as the pn-junction 2 is concerned, the barrier layer expansion will, due to the advantageous surface geometry, be more favorable in the lesser doped n-region so that when a voltage is applied across this pn-junction, the surface field strength will be smaller than the volumetric field strength, so that a volumetric breakdown will occur at this pn-junction 2 of the element when a voltage is reached which itself will not as yet have produced a breakdown at the surface.

Accordingly, it is an object of the present invention to provide a way in which the barrier layer expansion at the surface of a pn-junction can be increased with respect to the volumetric barrier layer expansion, and with this object in view, the present invention resides in a semiconductor arrangement having three or more layers of alternate conduction type, wherein for the purpose of increasing the barrier layer expansion of the pn-junction in the region of the surface with respect to volumetric expansion, alternately, the conditions leading to favorable surface geometry are fulfilled, and a layer is provided with a weakly-doped edge zone.

The present invention further resides in a method for making the above-described semiconductor arrangement.

Additional objects and advantages of the present invention will become apparent upon consideration of the following description when taken in conjunction with the accompanying drawings in which:

FIGURE 1, already referred to above, shows a three-layer semiconductor element having layers of alternate conductivity type.

Figure 1:
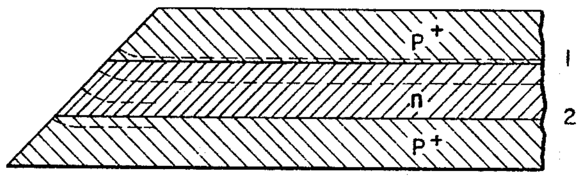
FIG. 1. PRIOR ART
Figure 2:
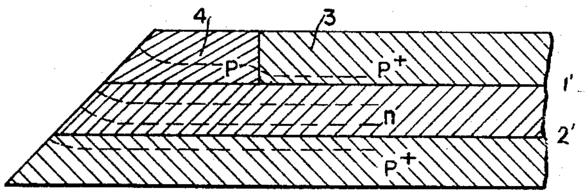
FIGURE 2 is a sectional view of a three-layer semiconductor element according to the present invention.
Figure 3:
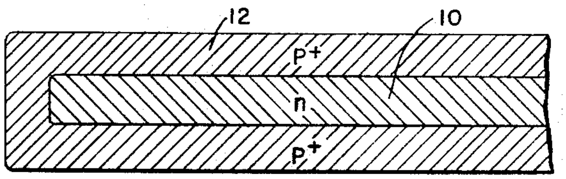
FIGURES 3, 4, 5 and 6, are sectional views showing the steps for making the semiconductor element of FIGURE 2.
Figure 4:
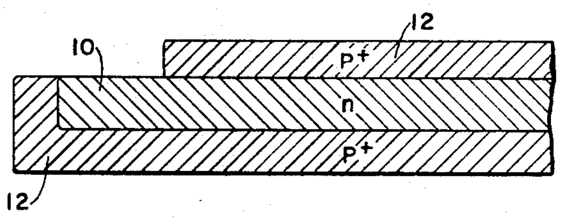

Referring now once again to the drawings, and now to FIGURE 2 thereof, the same shows a semiconductor element having two pn-junctions 1' and 2' which are formed by three successive layers $p^+np^+$, the layer 3 having a weakly-doped edge 4. The dashed line shows, schematically, how the barrier layer of the pn-junction 1' expands when a suitable reverse voltage is applied. Due to the low doping of the edge 4, the expanse of the barrier layer is, in the region of the lower doped surface, namely, at the edge, substantially greater than within the more strongly doped inner layer.

In such a semiconductor arrangement, it is the heavily doped $p^+$-layer which is responsible, mainly, for the volumetric characteristics, while it is the more weakly-doped p-layer at the surface, for example, an epitaxially grown layer, which is responsible for the blocking characteristics.

FIGURES 3 through 6 show the steps by which a semiconductor arrangement according to FIGURE 2 is made. Starting off with an n-conductive silicon slab 10, the same is subjected to a diffusion process, so as to form a $p^+np^+$ series of layers. This silicon plate 10, which is now completely enclosed by a diffusion layer 12, is next subjected to a conventional chemical, mechanical or electrochemical process so as to remove a portion of the diffusion layer 12, namely, a portion which is part of the upper $p^+$-doped layer, so as to leave the configuration shown in FIGURE 4. The semiconductor arrangement is then subjected to an epitaxial process in which it is exposed, e.g., at a temperature of 1100° C., to a mixture of silicon-tetrachloride, hydrogen, and a small amount of boron-trichloride, acting as a doping agent. As is well known, a p-doped layer grows on the silicon disc, epitaxially and monocrystalline.

Figure 5:
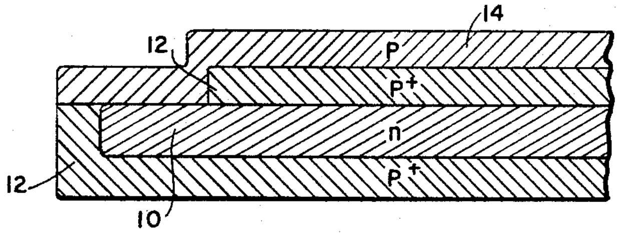

The doping concentration of the epitaxially grown layer is selected to be less than the doping concentration of the diffused zone and should correspond approximately to the concentration of the n-conducting material. The semiconductor arrangement after the epitaxial process will be as shown in FIGURE 5, wherein the epitaxial layer is shown at 14. That portion of the epitaxial layer which is above the upper $p^+$-doped layer is removed in any suitable manner, such as mechanically, chemically, or in any other way.

Figure 6:
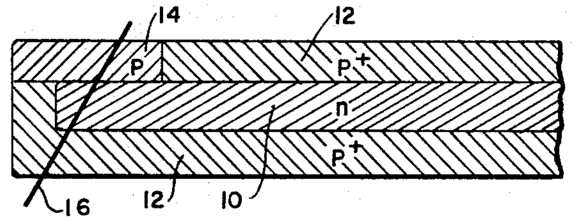

The semiconductor element is then completed by cutting it obliquely, along an incline, shown at 16, so that the expansion of the barrier layer is increased, for both pn-junctions, in the region of the surface of the pn-junction, this increase in size taking place in such direction that the volumetric breakdown will occur before the surface breakdown at each pn-junction. (FIG. 6).

A particular advantage of the present invention is that, in a multiple layer arrangement, each pn-junction will have its barrier layer increased at the surface with respect to barrier layer increase in volume, in that, alternately, the requirements for favorable surface geomerty of doping conditions are fulfilled at the pn-junctions which will make sure that the desired effect, the so-called controlled avalanche effect, is produced.

The outer layer which, in its edge region, will, opposite the inner region, have a low doping, can be produced in any other way. For example, it is not absolutely essential that it be produced by the epitaxial process, but it can be produced, for example, by weakening the doping of the edge region by local heating.

It will be understood that the above description of the present invention is susceptible to various modifications, changes and adaptations, and the same are intended to be comprehended within the meaning and range of equivalents of the appended claims.

What is claimed is:

1. A semiconductor arrangement having at least three layers of alternating conduction type including a weakly extrinsic doped layer between two more heavily doped layers such that two adjacent pn-junctions are formed by the arrangement, at least one of said more heavily doped layers being provided with a weakly doped lateral edge zone which entirely surrounds said layer thereby increasing the reverse voltage characteristic for the pn-junction adjacent said edge zone.

2. A semiconductor arrangement as defined in claim 1 wherein the lateral edge surface of said semiconductor arrangement is bevelled so as to increase the blocking ability of the two adjacent pn-junctions.

3. A semiconductor arrangement as defined in claim 1 wherein the lateral edge surface of said arrangement extends at an angle of less than 90° from the bottom surface of said more heavily doped layer not having said weakly doped edge zone toward the pn-junction adjacent said edge zone.

References Cited by the Examiner

UNITED STATES PATENTS

| | | | |
|---|---|---|---|
| 2,980,830 | 4/1961 | Shockley | 317—235 |
| 3,007,090 | 10/1961 | Rutz | 317—235 |
| 3,078,196 | 2/1963 | Ross | 148—33.5 |
| 3,088,856 | 5/1963 | Wannlund et al. | 148—33.5 |
| 3,146,135 | 8/1964 | Sah | 148—33.5 X |
| 3,178,798 | 4/1965 | Marinace | 148—175 |
| 3,179,860 | 4/1965 | Clark et al. | 317—234 |
| 3,184,350 | 5/1965 | Marinace | 148—175 |

FOREIGN PATENTS

| | | |
|---|---|---|
| 1,273,633 | 9/1961 | France. |
| 1,046,783 | 12/1959 | Germany. |
| 921,367 | 4/1960 | Great Britain. |

DAVID L. RECK, *Primary Examiner.*

C. N. LOVELL, *Assistant Examiner.*